US010645774B2

(12) United States Patent
Seif et al.

(10) Patent No.: US 10,645,774 B2
(45) Date of Patent: May 5, 2020

(54) POWER MANAGEMENT FOR A MICRO- OR NANO- WIRE LED LIGHT SOURCE

(71) Applicant: VALEO VISION, Bobigny (FR)

(72) Inventors: Lothar Seif, Bobigny (FR); Zdravko Zojceski, Bobigny (FR)

(73) Assignee: VALEO VISION, Bobigny (FR)

(*) Notice: Subject to any disclaimer, the term of this patent is extended or adjusted under 35 U.S.C. 154(b) by 0 days.

(21) Appl. No.: 15/758,228

(22) PCT Filed: Sep. 9, 2016

(86) PCT No.: PCT/EP2016/071375
§ 371 (c)(1),
(2) Date: Mar. 7, 2018

(87) PCT Pub. No.: WO2017/046015
PCT Pub. Date: Mar. 23, 2017

(65) Prior Publication Data
US 2018/0255615 A1 Sep. 6, 2018

(30) Foreign Application Priority Data
Sep. 14, 2015 (FR) ...................... 15 58530

(51) Int. Cl.
F21V 7/04 (2006.01)
H05B 45/00 (2020.01)
(Continued)

(52) U.S. Cl.
CPC ........... H05B 45/00 (2020.01); H01L 27/156 (2013.01); H01L 33/38 (2013.01); H05B 39/06 (2013.01);
(Continued)

(58) Field of Classification Search
CPC ............ H01L 51/5203; H01L 51/5209; H01L 51/5225; F21V 23/005
See application file for complete search history.

(56) References Cited

U.S. PATENT DOCUMENTS 8,403,512 B2 * 3/2013 Tsukahara ......... G02F 1/133603
257/98
8,835,903 B2 * 9/2014 Gwo ..................... H01L 27/156
257/13
(Continued)

FOREIGN PATENT DOCUMENTS

DE 10 2007 006 438 A1 8/2008
EP 2 900 039 A1 7/2015
JP 2012-256513 A * 12/2012

OTHER PUBLICATIONS

International Search Report dated Oct. 12, 2016 in PCT/EP2016/071375 filed Sep. 9, 2016.

Primary Examiner — Thuy V Tran
(74) Attorney, Agent, or Firm — Oblon, McClelland, Maier & Neustadt, L.L.P.

(57) ABSTRACT

A method of managing the power dissipated by an electroluminescence light source including electroluminescent rods having submillimeter dimensions protruding from a substrate and split into a plurality of identical groups. By using the measures of the invention, it becomes possible to manage the dissipation of power from the light source when faced with instantaneous variations in the strength of the electric current that powers the latter.

14 Claims, 2 Drawing Sheets

Figure 1:
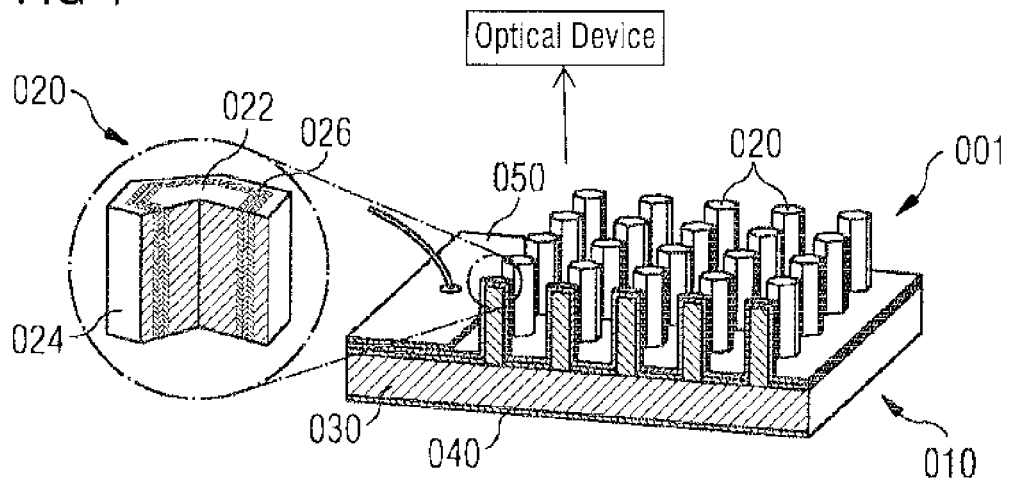

(51) Int. Cl.
*H01L 27/15* (2006.01)
*H01L 33/38* (2010.01)
*H05B 39/06* (2006.01)
*H05B 45/10* (2020.01)
H01L 33/08 (2010.01)
H01L 33/18 (2010.01)
H01L 51/52 (2006.01)
F21V 23/00 (2015.01)

(52) U.S. Cl.
CPC ............ *H05B 45/10* (2020.01); *F21V 23/005* (2013.01); *H01L 33/08* (2013.01); *H01L 33/18* (2013.01); *H01L 51/5203* (2013.01); *H01L 51/5209* (2013.01); *H01L 51/5225* (2013.01)

(56) References Cited

U.S. PATENT DOCUMENTS

| | | |
|---|---|---|
| 2012/0223289 A1 | 9/2012 | Gwo et al. |
| 2015/0048306 A1* | 2/2015 | Myers ................... H01L 33/06 257/13 |

* cited by examiner (A)

(B)

(C)

(D)

(E)

POWER MANAGEMENT FOR A MICRO- OR NANO- WIRE LED LIGHT SOURCE

The invention relates to the field of illumination and of light signaling, in particular for a motor vehicle.

In the field of illumination and of light signaling for motor vehicles, it is becoming increasingly common to use light sources having electroluminescent semiconductor components, for example electroluminescent diodes (LED). An LED component emits light rays when a voltage of a value at least equal to a threshold value called forward voltage is applied to these terminals. The dissipated power and therefore the temperature of the component is generally linearly dependent on the current that crosses the component.

In a known manner, one or several LEDs of a light module for a motor vehicle are powered by means of power supply control means, which comprise converter circuits. The power supply control means are configured to convert an electric current of a first strength, for example provided by a current source of the motor vehicle, such as a battery, into a load current having a second strength, which is different to the first strength. The load current generally has a constant strength.

When the light module is switched on, the strength of the electric current which passes through the LED component generally passes instantaneously from a zero value to the strength of the load current provided by the control means. This produces a power dissipation which follows the same profile, i.e. which instantaneously increases from a zero value to the power dissipated by the LED when the load current flows therethrough. The junction temperature of the LED therefore also varies extremely quickly, which generally degrades the junction quality, and therefore the lifespan of the LED component.

The aim of the invention is to propose a solution that overcomes the above-mentioned problem. More particularly, the aim of the invention is to manage the temperature of an LED component and the power dissipated thereby when it is switched on.

The object of the invention is a method of managing the power dissipated by a light source having a semiconductor comprising a plurality of electroluminescent rods having submillimeter dimensions protruding from a substrate and split into a plurality of identical groups. The method is characterized in that, from an electric current with a constant strength provided to power the plurality of groups, management means choose, at each instant, the number of groups powered in series, in order to meet a predetermined constraint on the power dissipated by the set of the groups.

Preferably, at each instant, all of the groups can be electrically powered.

The management means can preferably be configured to subdivide all of the groups into one or more sets of groups powered in series, these sets being, where applicable, powered in parallel.

Preferably, the rods can be arranged in an array. The array can preferably be regular, such that there is a constant space between two successive rods of a given line, such that the rods are placed in a staggered manner.

The height of a rod can preferably be between 1 and 10 micrometers.

The largest dimension of the end face can preferentially be less than 2 micrometers.

Preferably, the minimum distance that separates two immediately adjacent rods can be equal to 10 micrometers.

The area of the illuminating surface of the light source can, preferably, be 8 mm$^2$ at most.

The luminance obtained by the plurality of electroluminescent rods can, for example, be at least 60 Cd/mm$^2$.

The management means can, preferably, choose the configuration of the groups powered in series from a plurality of predetermined configurations, each configuration corresponding to a predetermined dissipated level of power.

At a first instant, all of the groups can preferably be powered in parallel, such that the power dissipated by each of the groups is minimal, and at a second instant, following the first instant, all of the groups can preferably be powered in series, such that the power dissipated by each of the groups is maximal.

Preferably, the first instant can correspond to an instant for switching on the light source. In an alternative, the first instant can correspond to an instant at which the temperature of the source exceeds a threshold predetermined value.

At the first instant, the groups can preferably be subdivided into as many sets, connected in parallel, as there are groups, each set including a single group.

At the second instant, all of the groups preferably form a single set.

At at least one intermediate instant between the first and the second instant, some of the groups can be powered in series, such that the power dissipated by the groups powered in series has an intermediate value between said minimum and maximum values.

At the intermediate instant, the groups can preferably be subdivided into a plurality of sets, the number of which is strictly greater than one and strictly less than the total number of groups.

Preferably, the constraint is an increasing function varying from a minimum value to a maximum value over a time period of a predetermined duration. The power constraint preferably corresponds to a temperature constraint of the light source.

In a preferred manner, the predetermined duration is less than or equal to 250 ms and preferably less than or equal to 100 ms. Preferably, a reconfiguration of the groups powered in series is carried out by the management means every 25 ms at most. The duration preferably corresponds to the time necessary for reaching a stable temperature at the semiconductor component.

Another object of the invention is a light source having a semiconductor, comprising a substrate and a plurality of electroluminescent rods with submillimeter dimensions protruding from the substrate. The light source is characterized in that the rods are split into a plurality of identical groups, each group being configured to be selectively powered with electricity.

The light source can advantageously comprise management means configured to implement the method according to the invention.

Preferably, the light source can comprise several groups of rods connected to different anodes. Each group can be electrically powered independently of the other or of the others. The rods of each group can advantageously all be of the same type, i.e. emitting in the same spectrum. The groups can advantageously be identical and represent a common forward voltage. Preferably, each group can therefore substantially comprise the same number of semiconductor wires or rods.

The management means can preferably be configured to organize a relative connection, in series and/or in parallel, of the groups of the light source such that the power dissipated by the set of the groups is less than or equal to the predetermined constraint.

Preferably, the management means can be configured to progressively increase, from the light source being switched on, the number of groups that are connected and powered in series.

Preferably, the management means can comprise an electronic circuit and/or a microcontroller element.

In a preferred manner, the substrate of the light source can comprise silicon. Advantageously, the substrate can be made of silicon.

The management means can preferably be integrated into the substrate.

Preferably, the light source can include a plurality of current injection means which can be connected in parallel to the groups, the management means being configured to choose the connection of the current injection means to the groups such that the variations in power dissipated by the set of the groups between each instant are continuous.

Another object of the invention is a light module comprising at least one light source suitable for emitting light rays and an optical device suitable for receiving the light rays and for producing a light beam. The module is characterized in that the light source or sources are in accordance with the invention and in that it comprises management means configured to implement the method according to the invention.

The measures of the invention are interesting in that they make it possible to limit the power dissipation variation over time, and therefore the temperature variation over time of a light source having electroluminescent diodes in the form of nanowires or microwires, also referred to as rods, whereas the variation over time of the load current which crosses the component is unlimited, i.e. it is an instantaneous variation as is observed when the light source is switched on. The method makes it possible to reconfigure the interconnection between various groups of semiconductor rods in a dynamic manner by choosing from a plurality of predetermined configurations. The use of a source having semiconductor microwires or nanowires makes it possible, in particular, to use a large number of groups, which gives rise to a large number of predetermined configurations and to a very fine level of detail in the method of managing and adjusting the power dissipated by the light source. Moreover, when the substrate of the source is made of silicon, the electronic circuit implementing the management means can be directly established on the substrate of the source. It becomes clear that the invention makes it possible to automatically prevent untimely jumps in temperature at the semiconductor junctions of a light source having electroluminescent wires, which increases the lifespan of such components and reduces the needs for maintenance and/or for replacement thereof. This advantage is achieved without modifying the power supply control means for the source, which means provide a current with a constant strength when the source is switched on.

Figure 2:
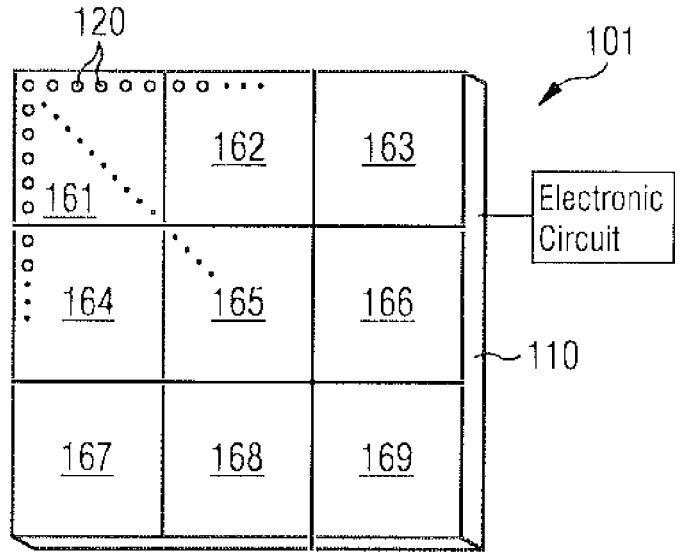
Figure 3:
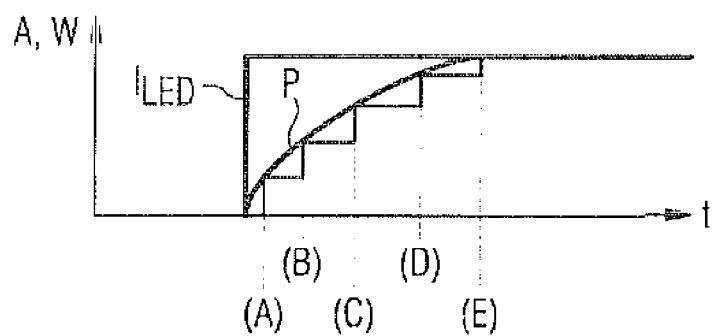

Other features and advantages of the present invention will be better understood from the description and the drawings wherein;

FIG. 1 is a representation of a light source as is used in a preferential embodiment of the present invention;

FIG. 2 schematically shows the groups of semiconductor rods of a light source according to a preferential embodiment of the invention;

FIG. 3 represents the progression over time of the strength of the current $I_{LED}$ provided to a light source, of a power constraint P and of the power dissipated following the use of the method according to a preferential embodiment of the invention;

FIGS. 4A-4E schematically show possible configurations of the groups shown in FIG. 2, such as to produce the dissipated power profile shown in FIG. 3, according to a preferential embodiment of the invention.

Without specific indication to the contrary, technical features described in detail for a given embodiment can be combined with the technical features described in the context of other embodiments described as an example and in a nonlimiting manner.

FIG. 1 illustrates an electroluminescent light source 001 according to a first embodiment of the invention. FIG. 1 illustrates the basic principle of the light source. The light source 001 comprises a substrate 010 on which is placed a series of electroluminescence diodes in the form of wires 020, also called electroluminescent rods, protruding from the substrate. The core 022 of each diode 020 is made of n-type semiconductor material, i.e. doped with electrons, whereas the envelope 024 is made from p-type semiconductor material, i.e. doped with holes. A recombination region 026 is provided between the n-type and p-type semiconductor materials. However, it can be envisaged to reverse the semiconductor materials depending, in particular, on the chosen technology.

The substrate is advantageously made of silicon and the rods have a diameter of less than a micron. In an alternative, the substrate comprises a layer of semiconductor material doped with holes and the wires have a diameter between 100 and 500 nm. The semiconductor material doped with electrons and with holes forming the diodes can advantageously be gallium nitride (GaN) or indium gallium nitride (InGaN). The height of a rod is typically between 1 and 10 micrometers, whereas the largest dimension of the end face is less than 2 micrometers. According to a preferred embodiment, the rods are arranged in an array with a regular layout. The distance between two rods is constant and equal to at least 10 μm. The rods can be placed in a staggered manner. The area of the illuminating surface of such a light source is 8 mm$^2$ at most. The source can produced a luminance of at least 60 Cd/mm$^2$.

With reference to FIG. 1, the substrate 010 comprises a main layer 030, advantageously made of silicon, a first electrode or cathode 040 placed on the face of the main layer which is opposite the diodes 020, and a second electrode or anode 050 placed on the face comprising the diodes 020. The anode 050 is in contact with the p-type semiconductor material forming the envelopes 024 of the diodes 020 and extending over the corresponding face of the substrate 010 such as to form a conductive layer between said envelopes 024 and the anode 050. The cores or hearts 022 of the rods are in contact with the semiconductor main layer 030 and thus in electrical contact with the cathode 040.

During the application of an electric voltage between the anode and the cathode, electrons of the n-type semiconductor material recombine with holes of the p-type semiconductor material and emit photons. The majority of the recombinations are radiative. The emitting face of the diodes or rods is the p-region since it is the most radiative.

In accordance with the invention, the light source 2 comprises several groups of rods connected to different anodes. Each group can therefore be electrically powered independently of the other or of the others. The rods of each group are advantageously all of the same type, i.e. emitting in the same spectrum. The groups are advantageously identical and represent a common forward voltage. Preferably, each group therefore comprises substantially the same number of semiconductor wires or rods.

FIG. 2 schematically shows a front view of a light source 101 comprising electroluminescent diodes in the form of electroluminescent wires 120 or rods protruding from a substrate 110. The rods are split into a plurality of identical groups 161-169. By way of example, the groups are shown as squares having identical dimensions. Other layouts and/or geometries of the groups can be produced without necessarily departing from the scope of the present invention. The large number of rods 120 present on a component particularly makes it possible to provide a plurality of groups which is more than the nine groups shown in this example.

The management method is described with reference to the source 101 of FIG. 2 and to the illustration of FIG. 3. FIG. 3 firstly describes the progression over time of the current ILED provided by a current source, possibly via converter elements or via a circuit (FIG. 2) for controlling the power supply of the source 101. When the source 101 is switched on, the variation in strength of the current ILED is instantaneous. In order to prevent the semiconductor junctions of the source 101 from being damaged, means for managing the dissipated power are configured such that the power dissipated by the source 101 is, at any instant, less than the power constraint P, whereas at any instant, all of the groups are electrically powered. The dissipated power, and therefore the temperature of the semiconductor junctions, gradually increases between a first zero value and a second maximum value according to the steps A-E. The temperature variation over time observed at the source 101 is therefore limited, whereas the variation over time of the strength of the provided current is unlimited.

To achieve the progression of the dissipated power in steps as is shown in FIG. 3, the management means are suitable for dynamically reconfiguring the relative electrical connection of the various groups 161-169. In particular, the management means are configured to adjust the number of groups powered in series, which has a direct impact on the current crossing the corresponding groups, and therefore also on the power dissipated thereby and on the junction temperature thereof. By increasing, gradually and in stages, the number of groups connected and powered in series, dissipated power steps A-E are produced. The duration of each step preferably corresponds to at least 25 ms, which generally corresponds to the time necessary for obtaining a stable temperature following a change in current in a group of diodes. The managing means can particularly be established by a circuit involving switches, transistors or other electronic components, or by means of a programmable microcontroller element.

Exemplary configurations corresponding to the steps A-E shown in FIG. 3 are given by FIGS. 4A-4E, respectively. Each group of rods 161-169 is represented by the symbol of a single electroluminescent diode in order to ensure that the diagram is clear. A person skilled in the art will be able to adjust the configurations depending on the intended practical use, depending on the characteristics of the groups of electroluminescent sources that are available and depending on the number of steps to be produced. The adjustment of these parameters falls within the skills of a person skilled in the art without departing from the scope of the present invention.

Figure 4:
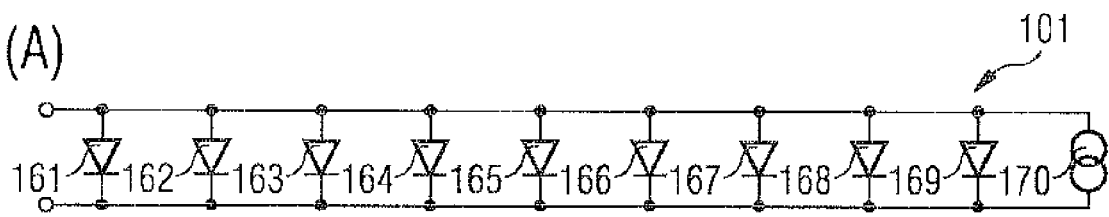
Figure 4:
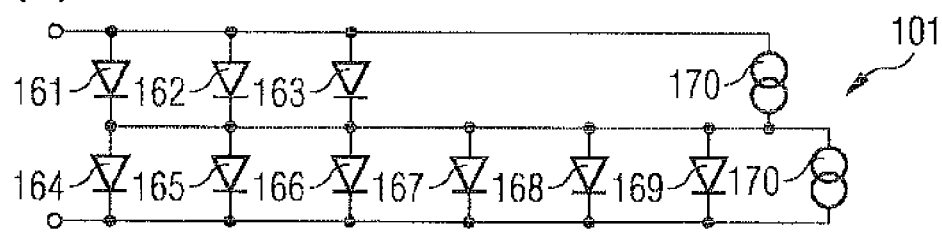
Figure 4:
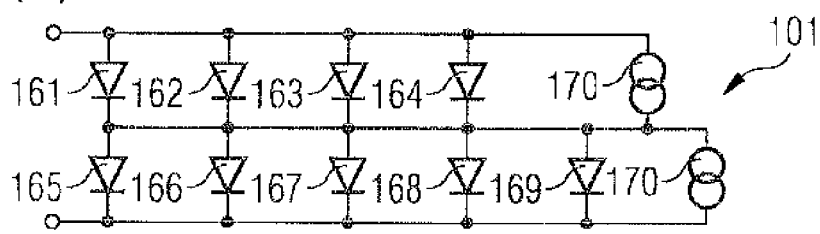
Figure 4:
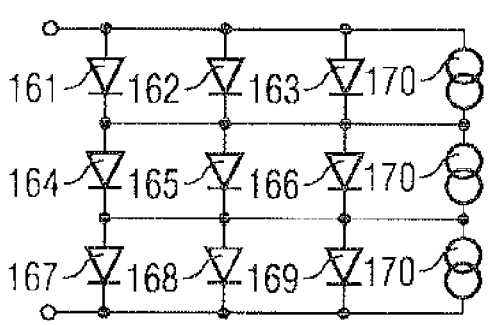
Figure 4:
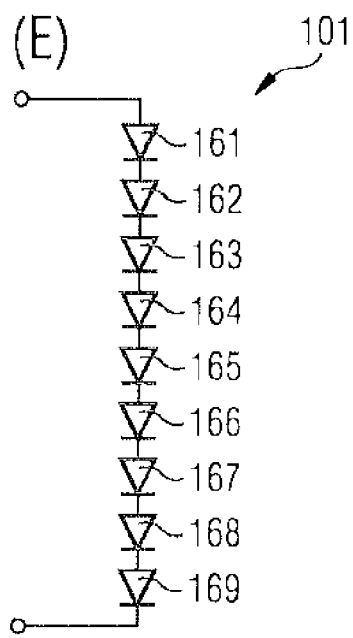

The first exemplary power supply configuration for the groups 161-169 is shown in FIG. 4A. All of the groups are powered in parallel, such that the electric current that passes through each of the groups has a minimum strength. The junction temperature in each of the groups can be considered to be equal.

The configuration of FIG. 4B increases the number of groups connected in series in twos. In particular, the pairs formed by the groups 161 and 164, 162 and 165, 163 and 166, are crossed by a current having a first strength greater than the strength of the current which crosses them in the example 4A. The respective temperatures thereof are therefore substantially equal with one another, but greater than the respective temperatures thereof in the configuration 4A. The groups 167-169 are crossed by a current having a second strength. In the configuration of FIG. 4C, an additional pair of groups, 164 and 168, is connected in series, and therefore the dissipated power, and the overall temperature of the source 101, increase with respect to the previous examples.

In the configuration of FIG. 4D, the nine groups 161-169 are connected in three groups of three in series. Each group is therefore crossed by a current having a same strength, greater than the strength of the current that crossed them in the previous examples. Finally, in the final configuration shown in FIG. 4E, all of the groups of diodes 161-169 are powered in series and the current $I_{LED}$ crosses all of the diodes. Advantageously, current injection means 170 can be provided via parallel connection, which allows an almost continuous reconfiguration of the connections.

By considering a reconfiguration every 25 ms, moving from the configuration 4A through to the configuration 4E, via the intermediate configurations, is achieved in approximately 150 ms. This management of the power dissipated by the light source 101 therefore allows the source to be instantaneously switched on. Although the emitted luminous flux, which is dependent upon the current which crosses the diodes, is not constant among the configurations 4A-4E, the rapid variation cannot be seen by the human eye. At the same time, an instantaneous variation in the junction temperature of the diodes is prevented, which makes the source more robust and more durable.

The substrate of the source 101, from which the semiconductor wires or rods project, can advantageously be made of silicon. In this case, the electronic components that produce the means for managing the power which have just been described can advantageously be established directly in or on the substrate of the light source. The resulting source therefore automatically manages the dissipated power thereof in order to protect the semiconductor junctions thereof from an untimely temperature increase. Alternatively, the management means can be produced on a printed circuit offset with respect to the substrate of the light source.

The invention claimed is:

1. A method of managing power dissipated by a light source having a semiconductor, the light source comprising a plurality of electroluminescent rods having a submillimeter protrusion from a substrate and split into a plurality of identical groups, the method comprising:
   connecting each group of the plurality of identical groups to different anodes; and
   directing, an electric current with a constant strength to the plurality of identical groups to power the light source, wherein
   a current crossing each group of the plurality of identical groups at each instant of the powering is selected to limit a power dissipation by the light source to a predetermined power dissipation constraint.

2. The method according to claim 1, further comprising:
   providing, at a first instant, each group of the plurality of identical groups with an electric current having a minimum strength, so the power dissipated is at a minimum power dissipation; and providing, at a second instant, following the first instant each group of the plurality of identical groups with an electric current having a second strength equal to the constant strength of the electric current directed to the plurality of identical groups so the power dissipated is at a maximum power dissipation.

3. The method according to claim 2, further comprising:
providing, at an intermediate instant between the first and the second instant some of the plurality of identical groups with an electrical current having a strength greater than the minimum strength and less than the constant strength, so the power dissipated has an intermediate power dissipation between the minimum and maximum power dissipation.

4. The method according to claim 1, wherein the predetermined power dissipation constraint varies from a minimum value to a maximum value over a time period of a predetermined duration.

5. The method according to claim 4, wherein the predetermined duration is less than or equal to 250 ms.

6. A light source having a semiconductor comprising:
a substrate; and
a plurality of electroluminescent rods with a submillimeter protrusion from the substrate,
wherein the plurality of electroluminescent rods are split into a plurality of identical groups, the plurality of identical groups being connected to different anodes and configured to be powered in series or parallel.

7. The light source according to claim 6, wherein at each instant of the powering a number of the plurality of identical groups to be powered in series to limit a power dissipation by the light source is based on a predetermined power dissipation constraint.

8. The light source according to claim 6, further comprising an electronic circuit and/or a microcontroller.

9. The light source according to claim 8, wherein the substrate is made of silicon.

10. The light source according to claim 9, wherein the electronic circuit is integrated into the substrate.

11. A light module comprising:
a light source according to claim 6, emitting light rays, wherein the light source comprises the plurality of identical groups of the plurality of electroluminescent rods; and
an optical device receiving the light rays to produce a light beam,
wherein a current crossing each group of the plurality of identical groups at each instant of the powering is selected so that to limit a power dissipation by the light source to a predetermined power dissipation constraint.

12. The light source according to claim 6, wherein at a first instant an electrical current having a minimum strength passes each group of the plurality of identical groups so the power dissipated is at a minimum power dissipation and at a second instant, following the first instant, an electrical current having a strength equal to the strength of the electrical current provided to the light source passes each group of the plurality of identical groups so the power dissipated is at a maximum power dissipation.

13. The light source according to claim 12, wherein at an intermediate instant between the first and the second instant, an electrical current having a strength greater than the minimum strength and lower than a constant strength passes some groups of the plurality of identical groups, so the power dissipated has an intermediate power dissipation between the minimum and maximum power dissipation.

14. A light module comprising:
a light source emitting light rays; and
an optical device receiving the light rays to produce a light beam;
wherein the light source has a semiconductor including
a substrate, and
a plurality of electroluminescent rods with a submillimeter protrusion from the substrate, the plurality of electroluminescent rods being split into a plurality of identical groups, each group of the plurality of identical groups being connected to different anodes,
wherein an electrical current passing each group of the plurality of identical groups at each instant of powering is selected to limit a power dissipation by the light source to a predetermined power dissipation constraint.

* * * * *